|| US011750177B2

(12) United States Patent
Hernes

(10) Patent No.: US 11,750,177 B2
(45) Date of Patent: Sep. 5, 2023

(54) DELAY CIRCUIT FOR CLOCK GENERATION

(71) Applicant: Disruptive Technologies Research AS, Blomsterdalen (NO)

(72) Inventor: Bjørnar Hernes, Trondheim (NO)

(73) Assignee: Disruptive Technologies Research AS

( * ) Notice: Subject to any disclaimer, the term of this patent is extended or adjusted under 35 U.S.C. 154(b) by 217 days.

(21) Appl. No.: 15/400,609

(22) Filed: Jan. 6, 2017

(65) Prior Publication Data

US 2017/0194950 A1 Jul. 6, 2017

Related U.S. Application Data

(60) Provisional application No. 62/275,370, filed on Jan. 6, 2016.

(51) Int. Cl.
*H03K 3/012* (2006.01)
*H03K 5/135* (2006.01)
(Continued)

(52) U.S. Cl.
CPC .............. *H03K 3/012* (2013.01); *G01D 5/24* (2013.01); *G06F 1/06* (2013.01); *H03K 5/133* (2013.01);
(Continued)

(58) Field of Classification Search
USPC ............ 324/602, 617, 76.35, 76.54; 331/111
See application file for complete search history.

(56) References Cited

U.S. PATENT DOCUMENTS

2009/0153214 A1* 6/2009 Takatori ............... H03H 11/265
327/262
2013/0342256 A1 12/2013 Wadhwa et al.
2017/0194944 A1* 7/2017 Hernes .................. H03K 3/012

OTHER PUBLICATIONS

International Search Report, for International Application No. PCT/IB2017/000323, dated Aug. 31, 2017, 6 pages.
(Continued)

*Primary Examiner* — Vincent Q Nguyen
(74) *Attorney, Agent, or Firm* — Onyx IP Group

(57) ABSTRACT

A clock delay circuit is configured to generate a delayed clock signal based on an input clock signal, the delayed clock signal delayed by a delay time ($T_{DEL}$). The circuit includes a current mirror configured to generate starved currents based on the reference current, a plurality of inverters, and a Schmitt trigger configured to generate an output signal in response to the input clock signal, wherein the Schmitt trigger output signal increases from a low signal to a high signal over a period ($T_{CHARGE}$) correlated with $T_{DEL}$. Some inverters and the Schmitt trigger are configured to be current starved when the input clock signal is high and are configured to be shorted to ground and the reference current when the input clock signal is low. $T_{DEL}$ is based on $T_{CHARGE}$ and $T_{CHARGE}$ is based on C, $N_{TOP}$, $V_{ST,High}$, and a supply voltage.

9 Claims, 4 Drawing Sheets

(51) Int. Cl.
  *H03K 5/133* (2014.01)
  *G01D 5/24* (2006.01)
  *G06F 1/06* (2006.01)
  *H03K 17/955* (2006.01)
  *H03K 5/00* (2006.01)

(52) U.S. Cl.
  CPC .......... *H03K 5/135* (2013.01); *H03K 17/955* (2013.01); *H03K 2005/00013* (2013.01)

(56) References Cited

OTHER PUBLICATIONS

International Preliminary Report on Patentability, for International Application No. PCT/IB2017/000323, dated Jul. 9, 2019, 12 pages.
Wojciech Kolodziejski et al., "Current controlled delay line elements' improvement study", Signals and Electronic Systems (ICSES), 2012 International Conference On, IEEE, Sep. 18, 2012 (Sep. 18, 2012), pp. 1-4, XP032279599, DOI: 10.1109/ICSES.2012.6382228.
Kobenge S B et al., "A power efficient digitally programmable delay element for low power VLSI applications", Duality Electronic Design, 2009. ASQED 2009. 1st Asia Symposium On, IEEE, Piscataway, NJ, USA, Jul. 15, 2009 (Jul. 15, 2009), pp. 83-87, XP031514007.

\* cited by examiner

DELAY CIRCUIT FOR CLOCK GENERATION

TECHNICAL FIELD

The present disclosure relates generally to readout circuitry, and more particularly, to delay elements for clock generation circuitry associated with readout circuitry.

BACKGROUND

In certain electrical circuit applications, such as those circuits utilized in wireless sensors for Internet of Things (IOT) applications, long battery life for such applications, while maintaining a small sized component, is often required. Such requirements may necessitate that the circuitry is designed to have very low power dissipation. Sensor readout circuitry, ideally, is completely off when such circuitry is not polling sensors, while such circuitry must wake up in the event of desired sensor data acquisition.

When a sensor acquisition command is given by, for example, a rising edge of an input clock, sensor readout circuitry must be started up, then must excite the sensor, and measure and quantize the sensor response. Accordingly, to sequence this procedure for the sensor, a clock generator may be needed. Such clock generators may need to set the necessary time durations for the other components of the sensor readout circuitry.

While prior art sensor readout circuitry may be capable of setting such time durations, often such clock generation circuitry may be susceptible to unwanted power dissipation. As such sensors are of the "always on" type, lessening of power dissipation is always desired. Therefore, circuits for clock generation, which utilize delay elements that are configured to reduce power dissipation, are desired.

The present disclosure is directed at addressing one or more of the deficiencies and disadvantages set forth above. However, it should be appreciated that the solution of any particular problem is not a limitation on the scope of this disclosure or of the attached claims except to the extent expressly noted.

SUMMARY OF THE DISCLOSURE

In one aspect of the present disclosure, a clock delay circuit is disclosed. The clock delay circuit is configured to generate a delayed clock signal based on an input clock signal, the delayed clock signal delayed by a delay time ($T_{DEL}$). The circuit includes an input module configured to receive the input clock signal, a reference current source providing a reference current, and a capacitor configured to charge or discharge based on the input clock signal and an output clock signal, the capacitor having a capacitance (C) and connected to a top node. The circuit further includes a current mirror configured to generate one or more starved currents based on the reference current and having a current scaling factor and configured to provide a scaled version of the reference current at the top node, scaled by a current scaling factor ($N_{TOP}$). The circuit further includes a Schmitt trigger configured to generate a Schmitt trigger output signal in response to the input clock signal, wherein the Schmitt trigger output signal increases from a low signal to a high signal over a charging period of time ($T_{CHARGE}$) correlated with $T_{DEL}$, in response to a high signal input from the input clock signal, via the switching module, the high signal based on an upper threshold voltage ($V_{ST,High}$) of the Schmitt Trigger, wherein the Schmitt trigger output signal reverts to a low signal in response to a low signal from the input clock signal, and wherein the Schmitt trigger is configured to be current starved by a first starved current of the one or more starved currents when the input clock signal is high and the Schmitt trigger is configured to be shorted to ground and the reference current when the input clock signal is low. The circuit further includes a plurality of inverters configured to generate the delayed clock signal based on the Schmitt trigger output signal, wherein one or more of the plurality inverters are configured to be current starved by a second starved current of the one or more starved currents when the input clock signal is high and configured to be shorted to ground and the reference current when the input clock signal is low. $T_{DEL}$ is based on $T_{CHARGE}$ and $T_{CHARGE}$ is based on C, $N_{TOP}$, $V_{ST,High}$, and a voltage of the reference current source ($V_{SUPL}$).

In another aspect of the present disclosure, another clock delay circuit is disclosed. The clock delay circuit is configured to generate a delayed clock signal based on an input clock signal, the delayed clock signal delayed by a delay time ($T_{DEL}$). The circuit includes an input module configured to receive the input clock signal, a reference current source providing a reference current, and a capacitor configured to charge or discharge based on the input clock signal and the output clock signal, the capacitor having a capacitance (C) and connected to a top node, C being configurable via a capacitor DAC of the capacitor and $T_{DEL}$ being configurable via configuration of C. The circuit further includes current mirror configured to generate one or more starved currents based on the reference current and having a current scaling factor and configured to provide a scaled version of the reference current at the top node, scaled by a current scaling factor ($N_{TOP}$), the current mirror including a current steering digital-to-analog converter (DAC) and $T_{DEL}$ is configurable by altering $N_{TOP}$, via the current steering DAC. The circuit further includes a Schmitt trigger configured to generate a Schmitt trigger output signal in response to the input clock signal, wherein the Schmitt trigger output signal increases from a low signal to a high signal over a charging period of time ($T_{CHARGE}$) correlated with $T_{DEL}$, in response to a high signal input from the input clock signal, via the switching module, the high signal based on an upper threshold voltage ($V_{ST,High}$) of the Schmitt Trigger, wherein the Schmitt trigger output signal reverts to a low signal in response to a low signal from the input clock signal, and wherein the Schmitt trigger is configured to be current starved by a first starved current of the one or more starved currents when the input clock signal is high and the Schmitt trigger is configured to be shorted to ground and the reference current when the input clock signal is low. The circuit further includes a plurality of inverters configured to generate the delayed clock signal based on the Schmitt trigger output signal, wherein one or more of the plurality inverters are configured to be current starved by a second starved current of the one or more starved currents when the input clock signal is high and configured to be shorted to ground and the reference current when the input clock signal is low. $T_{DEL}$ is based on $T_{CHARGE}$ and $T_{CHARGE}$ is based on C, $N_{TOP}$, $V_{ST,High}$, and a supply voltage ($V_{SUPL}$) and $T_{DEL}$ is configured based on the following equation:

$$T_{DEL} = T_{CHARGE} = \frac{C}{N_{TOP} \times I_R} \times (V_{SUPL} - V_{ST,High}).$$

In yet another aspect of the present disclosure, a clock generator for a capacitive sensor system is disclosed. The capacitive sensor system includes a reference current source providing a reference current for the clock generator and the capacitive sensing system has a sensing charge current. The clock generator includes a first delay circuit configured to generate a waiting delay ($T_{Wait}$) corresponding with a waiting time for the reference current to settle within delay elements throughout the capacitive sensing system, the first delay circuit utilizing current mirroring, based on the reference current, to selectively provide a starved current one or more delay elements within the first delay circuit. The clock generator further includes a second delay circuit triggered by the first delay circuit and configured to generate a charging delay ($T_{Charge}$) which is based on a charging time of the capacitive sensing system and the sensing charge current is correlated with a second delay charge current of the second delay circuit, the second delay circuit utilizing current mirroring, based on the reference current, to selectively provide a starved current one or more delay elements within the second delay circuit.

These and other aspects and features will be more readily understood when reading the following detailed description in conjunction with the accompanying drawings.

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Figure 1:
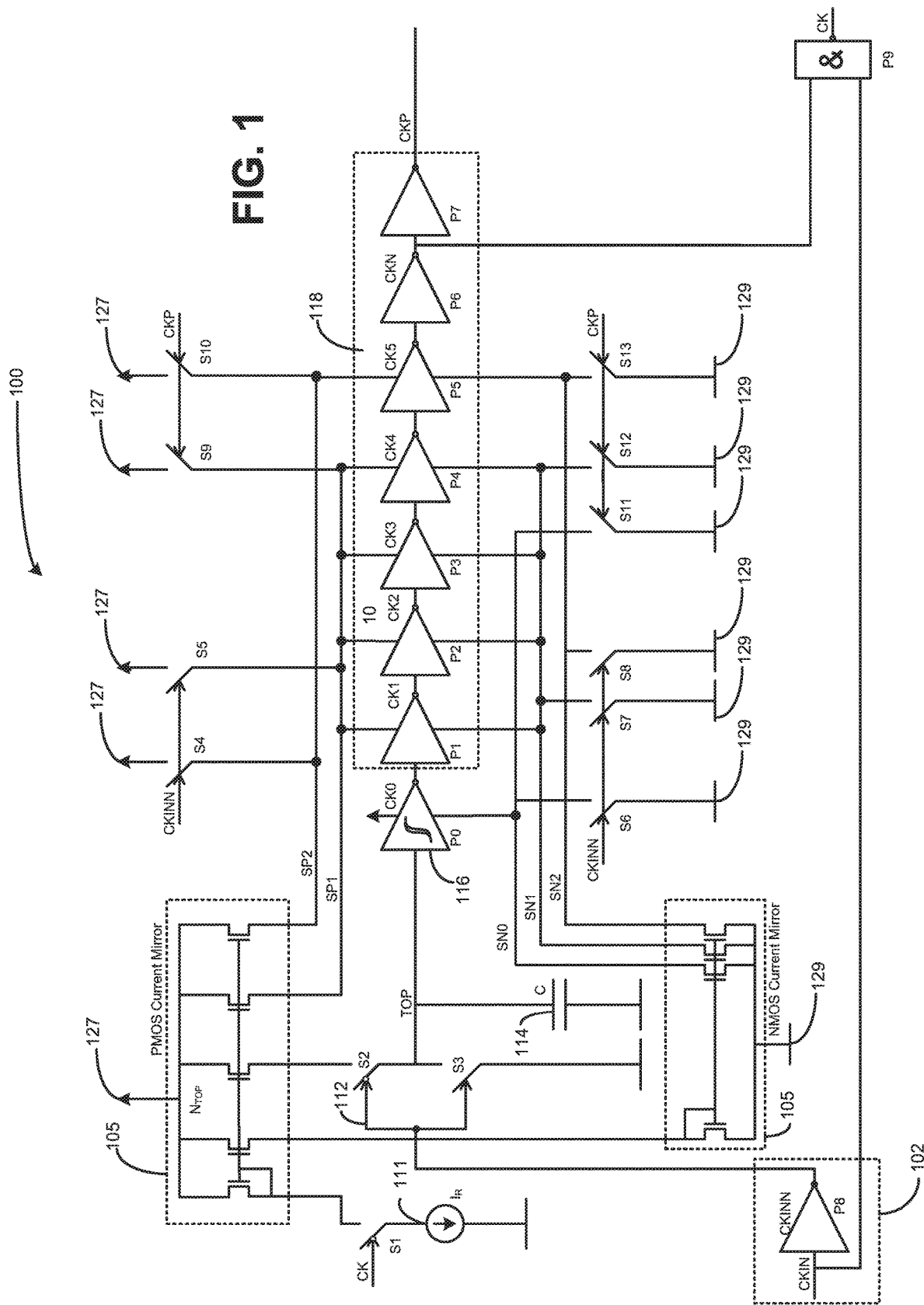
FIG. 1 is a schematic depiction of one exemplary clock delay device or circuitry of the present disclosure.

Referring to FIG. 1, an example circuit diagram for a clock delay circuit 100 is shown. The clock delay circuit 100 may be utilized in the context of a variety of electronics applications, such as, but not limited to, IOT sensors. The clock delay circuit 100 is configured to combat potential high short currents, which may be caused by long edge times in a Schmitt trigger 116 and/or one or more of a plurality of inverters 118. To combat such shorts due to long edge times, the Schmitt trigger 116 and one or more of the inverters 118 may be, during certain portions of cycles of the delay circuit 100, current starved. Current starving of the Schmitt trigger 116 and/or one or more of the inverters 118 may limit current shorting of such elements to the starved current and, thusly, may limit power dissipation in the relaxation oscillator 100, in comparison to prior art circuitry. Current starving of such elements may be achieved by utilizing a current mirror 105, as discussed in more detail below.

The clock delay circuit 100 may be configured to generate a delayed clock signal CKP, based on an input clock signal CKIN and delayed by a time $T_{DEL}$ and/or may generate an output clock signal CK, by utilizing components and component values (e.g., capacitances, currents, etc.) of the circuit 100. The circuit may include an input module 102, which receives the input clock signal CKIN. In some examples, such as the depiction of the input module 102 in FIG. 1, the input module 102 may include an inverter P8 which generates an inverted input clock signal CKINN. CKINN may then be provided to a switching module 112, which is configured to provide current from a current source 111 to charge a capacitor 114 when CKIN is high and discharge the capacitor 114 when CKIN is low.

On a rising high signal from CKIN, the output clock signal CK (formation of which is described below) may go low, which causes the switch S1 to close, which causes the reference current ($I_R$) of the current source 111 to be applied to the current mirror 105. The current mirror 105 then provides a current, based on the reference current, to the TOP node, which charges the capacitor 114, said current being defined as $N_{TOP} \times I_R$, wherein $N_{TOP}$ is a current scaling factor or limit caused by the current mirror 105.

When CKIN is high, therefore CKINN is low, switches S4, S5, S6, S7, and S8 open, which allows a first starved current from the current mirror 105 to current starve the Schmitt trigger 116, via node SN0, and allows a second starved current to current starve inverters P1, P2, P3, P4.

Current starving of the Schmitt trigger 116 and/or one or more inverters 118 may refer to a system of limiting current to supply terminals of the starved Schmitt trigger 116 and/or inverters 118 via the current mirror 105. A non-starved Schmitt trigger and/or inverter may, theoretically, draw as much current as it likes; however, the starved Schmitt trigger 116 and/or inverter(s) 118 are limited by the current mirror 105. When starved, such elements may be limited to current provided by the current mirror 105 and, thusly, limited in what current they can pull. When current starved, the Schmitt trigger 116 and one or more inverters 118 (e.g., inverters P1, P2, P3, P4, and P5) may limit a short current of such device to the value of the starved current provided to said device, when said device is current starved.

In the instant example of the delay circuit 100, the current mirror 105 comprises a PMOS current mirror connected one or more of the inverters 118 and an NMOS current mirror connected to negative supply terminals of the Schmitt trigger 116 and one or more of the inverters 118. However, other devices or configurations for current mirrors, as known in the art, may alternatively be used as the current mirror 105 and the invention is certainly not limited to the shown configuration. Accordingly, while FIG. 1 shows these current mirrors as being implemented using a plurality of MOSFET components, the current mirror 105 may be implemented in alternative configurations, without changing functionality of the relaxation oscillator 105.

Figure 2:
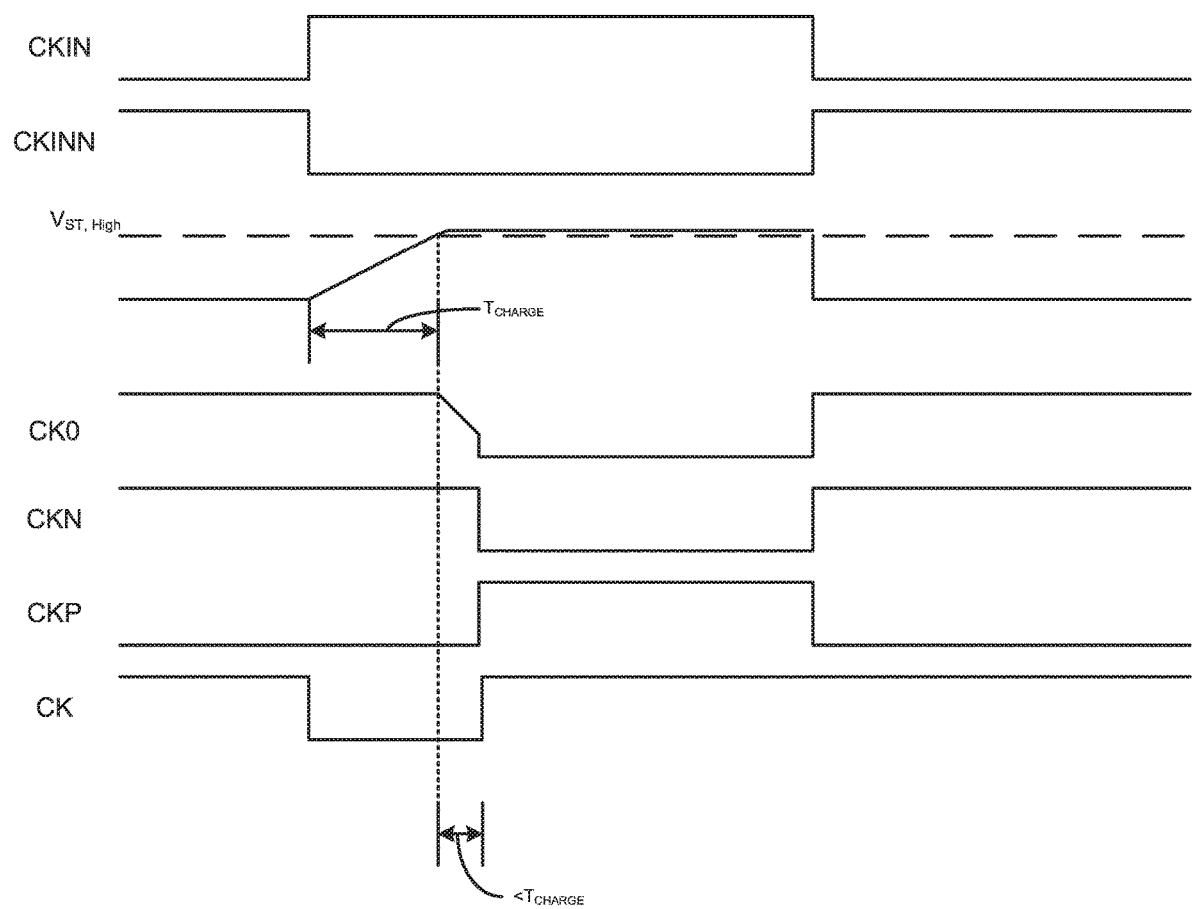
FIG. 2 is a diagrammatic view of a timing diagram of the clock delay device of FIG. 1.

As the voltage ($V_{TOP}$) of the TOP node crosses an upper threshold voltage ($V_{ST,High}$) of the Schmitt trigger 116, the output at the Schmitt trigger 116 CK0 goes low, as shown in the timing diagram of FIG. 2. CK0 may then propagate through the plurality of inverters 118. When S4-S8 are open as CKIN is high, inverters P1, P2, P3, P4, and P5 are current starved inverters. The current starved inverters are utilized to limit short current due to slow clock edges of output signals CK0-CK4, while P6 and P7 are normal inverters utilized for further clock signal buffering, ultimately producing the delayed clock signal CKP.

When CKN, which is an inverse of the delayed output signal CKP, goes low and CKIN is still high, CK goes high (e.g., performed by the logic of the NAND gate shown in FIG. 1). When CK is high, switch S1 is opened, which cuts current to the current mirror 105. Further, with CKP high as CKN is low, switches S9, S10, S11, S12, and S13 are turned on. Turning on these switches causes nodes SP1 and SP2 to be shorted to the global supply terminals 127 and cause nodes SN0, SN1, and SN2 to be shorted to negative supply terminals 129. With CKP high and due to the switching, inverters P1, P2, P3, P4, and P5 now become normal inverters and the Schmitt trigger 116 becomes a normal Schmitt trigger, rather than being current starved.

When CKIN goes low and, therefore CKINN goes high, the switching module 102 turns off S2 and turns on S3, which shorts TOP to ground and discharges the capacitor 114. The Schmitt trigger 116 and the inverters 118 are then triggered, causing CKN to go high and CKP to go low. With CKP low, switches S9, S10, S11, S12, S13 are turned off and switches S4, S5, S6, S7, and S8 are turned on. Thus, the current starved nodes SP1, SP2, SN0, SN1, and SN2 are still connected to the supply terminals 127, 129.

The time in which CK is low ($T_{CK,LOW}$) is determined by the time in which the capacitor 114 is charged from 0 V to a voltage of the supply ($V_{SUPL}$) minus $V_{ST,High}$, multiplied by the current at TOP, or represented in the following equation:

$$T_{CK,LOW} = T_{CHARGE} = \frac{C}{N_{TOP} \times I_R} \times (V_{SUPL} - V_{ST,High}).$$

The time for $T_{CK,LOW}$ may be in an order of 1 microsecond to 10 milliseconds. Input voltage of the Schmitt Trigger 116 at TOP is thus close to its threshold voltage $V_{ST,High}$ for a relatively long time, as $T_{CK,LOW}$ is a relatively short time, and thereby the Schmitt trigger 115 conducts a large short current from its positive to negative supply terminals. Because of the slow voltage at the Schmitt trigger 116 input, its output voltage may also be slow. Therefore shaping of the clock edges by the inverters 118 is necessary. Further, such inverters may also conduct high short currents, without precautions taken (e.g., the way of providing current starving discussed above).

Accordingly, Schmitt trigger 116 and inverters P1, P2, P3, P4, and P5 are only current starved when the capacitor 114 is charged, otherwise the power terminals of Schmitt trigger 116 and inverters P1, P2, P3, P4, and P5 are shorted to the supply terminals 127, 129. As discussed above, when charging the capacitor 114, such current starving of the Schmitt trigger 116 and any of the inverters 118 may lessen power dissipation. When the capacitor 114 is not charging, the input current (IR) is off and subsequently starved currents are not available. Therefore, the supply terminals of the Schmitt trigger 116 and inverters P1, P2, P3, P4, and P5 are connected to global supply terminals 127, 129 and, thus, act as normal Schmitt triggers and inverters. This is feasible because, when CKIN goes low, the node TOP is shorted to ground, which causes the Schmitt trigger 116 input to experience a steep edge and, thus, short currents at the Schmitt trigger 116 and inverters 118 is not of concern. Accordingly, this may make the reset-time of the clock generator circuit short and ready for a new rising edge of CKIN.

Various electrical values for components of the delay circuit 100 are configured such that $T_{DEL}$ is based on $T_{CHARGE}$ and $T_{CHARGE}$ is based on C, $N_{TOP}$, $V_{ST,High}$, and a supply voltage ($V_{SUPL}$). In some examples, the $T_{DEL}$ is determined using the following equation:

$$T_{DEL} = T_{CHARGE} = \frac{C}{N_{TOP} \times I_R} \times (V_{SUPL} - V_{ST,High}).$$

As the delay circuit 100 is a delay circuit for a clock signal, the signal CKP is a delayed version of the input signal CKIN. Further, as the delay circuit 100 can be utilized for a variety of applications, the output clocks can be generated by a combination of the input clock and the delayed clocks. For example, the NAND gate P9, as shown, generates the output clock CK via a NAND comparison of CKIN and the inverse of CKP, CKN. FIG. 2 is illustrative of this relationship.

Figure 3:
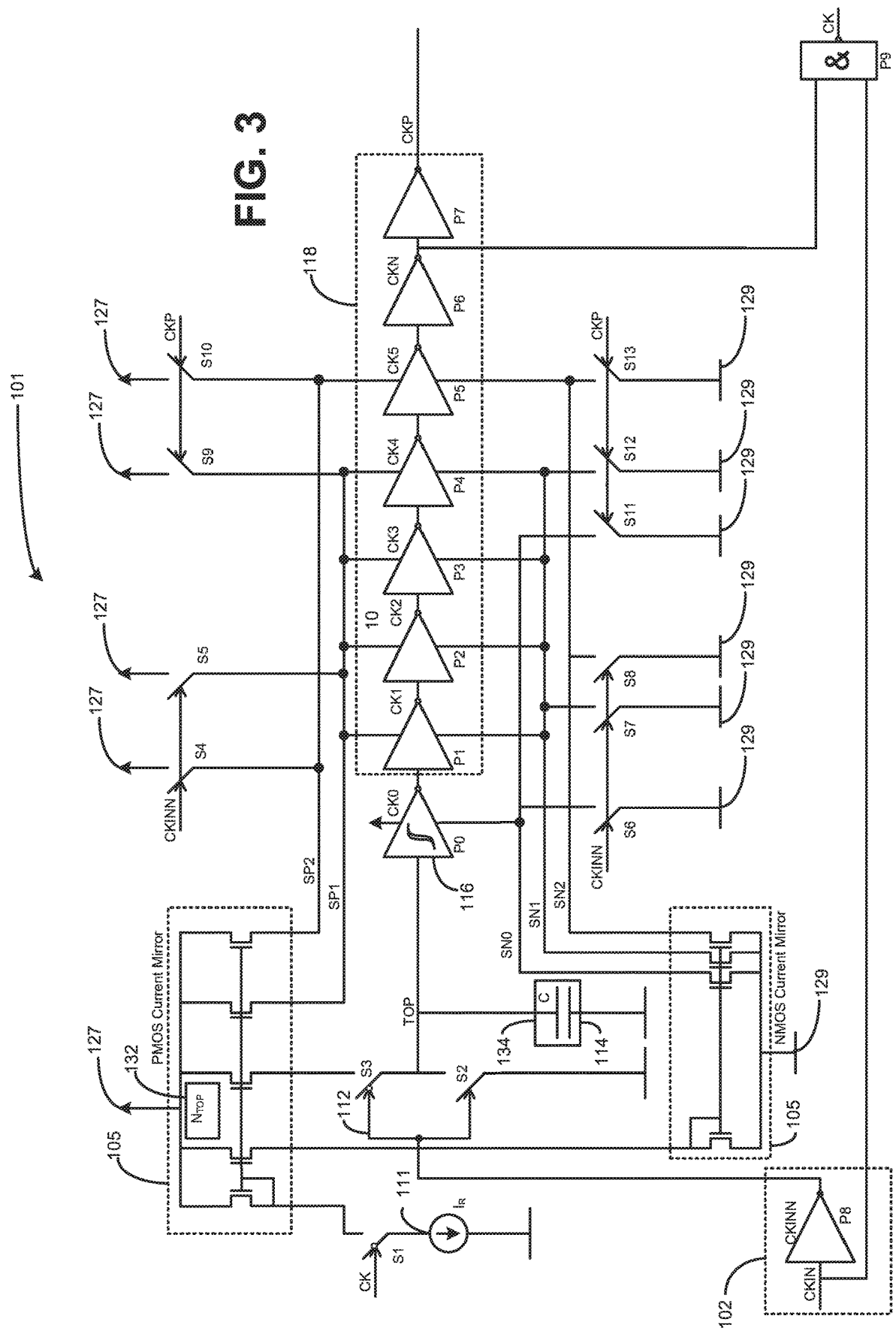
FIG. 3 is another schematic depiction of an alternative implementation of the clock delay device or circuitry of the present disclosure.

In some examples, such as the example delay circuit 101 of FIG. 3, one or more digital-to-analog converters (DACs) may be utilized to set and/or alter values of C, $N_{TOP}$, and/or $I_R$, to alter $T_{DEL}$, based on the aforementioned equation for $T_{DEL}$. Aside from the DACs, the delay circuit 101 of FIG. 3 includes like or similar elements to those of the delay circuit 100 of FIG. 1. For example, the delay circuit 101 may include a current steering DAC 132 operatively associated with or part of the current mirror 105. The current steering DAC 132 may be configured to alter or set $N_{TOP}$, such that $T_{DEL}$ is configurable by altering or setting $N_{TOP}$ via the current steering DAC 132. Further, the value for C in the circuit 101 may be set by a capacitor DAC 134 that is part of or associated with the capacitor 134. The capacitor DAC 134 may alter or set the capacitance value C and, thusly, $T_{DEL}$ is configurable by altering or setting C via the capacitance DAC 134. One or both of the current steering DAC 132 and the capacitance DAC 134 may be utilized in setting or altering the $T_{DEL}$.

Figure 4:
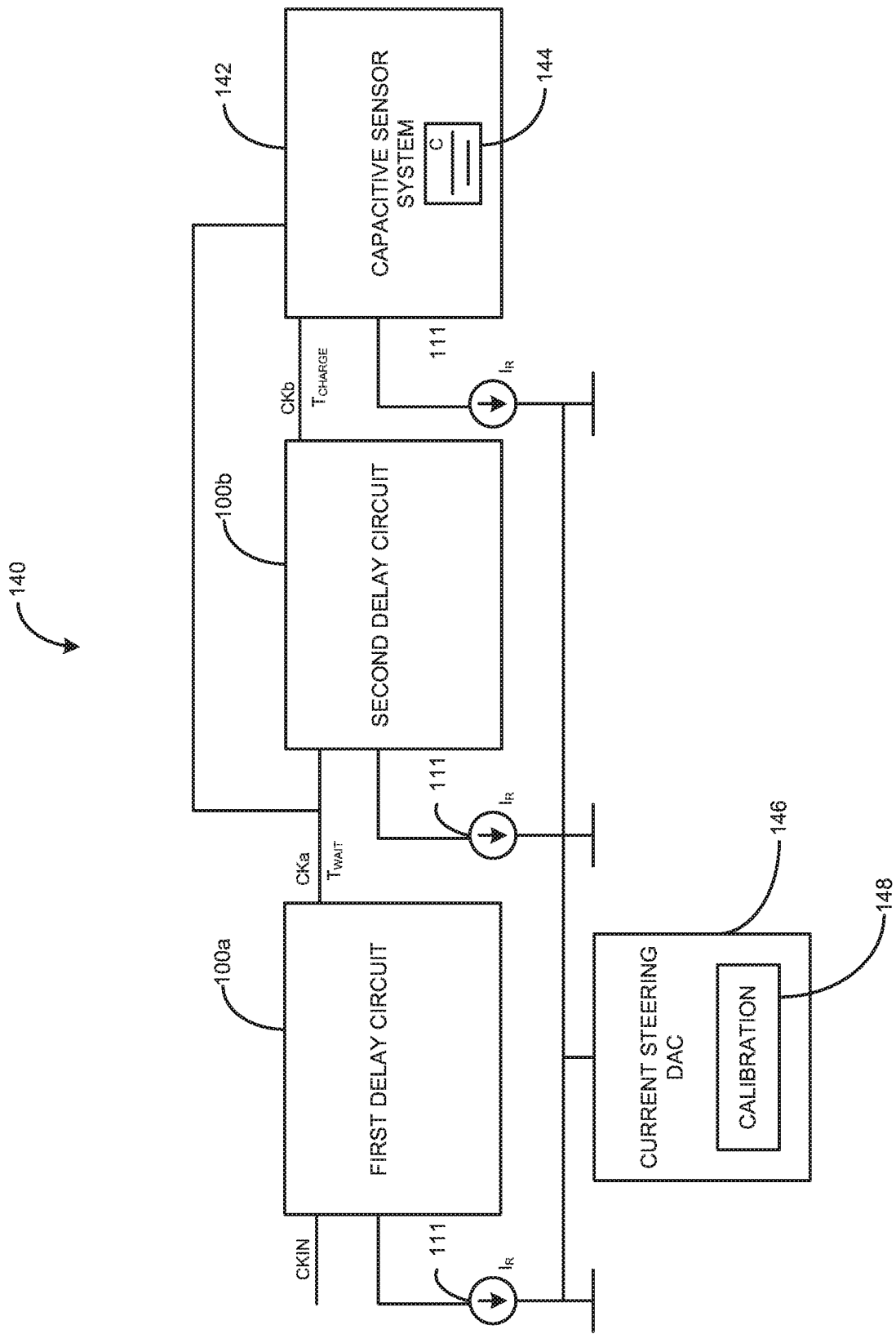
FIG. 4 is an example block diagram of a clock generator for a capacitive sensor system, utilizing the delay circuit(s) of FIGS. 1 and 3, in accordance with the present disclosure.

Turning now to FIG. 4, an example clock generator 140 for a capacitive sensing system 142 is shown. The capacitive sensing system may include a reference current source 111 providing a reference current for the clock generator 140, which may be a bias current $I_R$ for multiple delay elements and used for charging of a capacitive sensor 144 of the capacitive sensing system 142. The system may include a first delay circuit 100a and a second delay circuit 100b; each of the first and second delay circuits 100a, 100b designed in accordance with one or both of the delay circuit 100 of FIG. 1 or the delay circuit 101 of FIG. 2. The first delay circuit 100a may be configured to generate a waiting delay ($T_{Wait}$) corresponding with a waiting time for the reference current $I_R$ to settle within delay elements, throughout the capacitive sensing system 142. The first delay circuit may output a clock signal CKa, which may be configured based, at least in part, on $T_{Wait}$. The second delay circuit 100b may be triggered by the first circuit 100a (by, for example, CKa) and may generate a charging delay $T_{Charge}$, which is defined as the charge time of the capacitive sensor system. The charge current C for the second delay circuit 100b may closely match the a charge current of the capacitive sensing system 142. Accordingly, the clock generator 140 output clocks of CKa, in accordance with $T_{Wait}$, and CKb, in accordance with $T_{Charge}$, may be applied to the capacitive sensing system 142.

In some examples of the clock generator 140, both $T_{Wait}$ and $T_{Charge}$ may be altered by changing the reference current $I_R$. In some such examples, the charge current of the capacitive sensor system 142 may be altered in a similar way, by changing the reference current $I_R$. For performing such changes to $I_R$, in some examples, $I_R$ may be set or altered digitally via a current steering DAC 146, which may be global to the entire clock generator 140 and/or capacitive sensing system 142. Further, such setting of the current steering DAC 146 may be based on data and/or determinations of a calibration procedure 148.

While the above example of FIG. 4 shows a clock generator having two delay circuits 100a, 100b arranged in series, other example clock generators, or other clocking devices, are certainly possible based on the contents of the present disclosure. For example, such devices may include any number of delay circuits 100, 101, or delay elements contained therein. Additionally, any such combination of delay circuits 100, 101, or delay elements contained therein may be arranged in series or parallel connections. Further, each delay circuit 100, 101 used by such systems could have equal or different delays. Such delays could be set digitally via DACs of the embodiments mentioned above and such DACs may be configured in response to calibration procedures. Clocks generated by the system described above may be combined or otherwise processed by a system using one or more digital ports (e.g., NAND gats, NOR gates, and the like). Finally, any of the aforementioned embodiments or elements thereof may generate any required clocks for use in larger analog or digital circuit systems.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A clock delay circuit configured to generate a delayed clock signal based on an input clock signal, the delayed clock signal delayed by a delay time ($T_{DEL}$), the clock delay circuit comprising:
   an input module configured to receive the input clock signal;
   a reference current source providing a reference current;
   a capacitor configured to charge or discharge based on the input clock signal and an output clock signal, the capacitor having a capacitance (C) and connected to a top node;
   a current mirror configured to generate one or more starved currents based on the reference current and having a current scaling factor and configured to provide a scaled version of the reference current at the top node, scaled by a current scaling factor ($N_{TOP}$);
   a switching module configured to provide current from the reference current source to charge the capacitor when the input clock signal is high and discharge the capacitor when the input clock signal is low;
   a Schmitt trigger configured to generate a Schmitt trigger output signal in response to the input clock signal, wherein the Schmitt trigger output signal increases from a low signal to a high signal over a charging period of time ($T_{CHARGE}$) correlated with $T_{DEL}$, in response to a high signal input from the input clock signal, via the switching module, the high signal based on an upper threshold voltage ($V_{ST,High}$) of the Schmitt Trigger, wherein the Schmitt trigger output signal reverts to a low signal in response to a low signal from the input clock signal, and wherein the Schmitt trigger is configured to be current starved by a first starved current of the one or more starved currents from the current mirror when the input clock signal is high and the Schmitt trigger is configured to be shorted to ground and the reference current when the input clock signal is low;
   a plurality of inverters configured to generate the delayed clock signal based on the Schmitt trigger output signal, wherein one or more of the plurality inverters are configured to be current starved by a second starved current of the one or more starved currents when the input clock signal is high and configured to be shorted to ground and the reference current when the input clock signal is low; and
   a first plurality of switches configured to supply one or more of the Schmitt trigger and one or more of the plurality of inverters with the one or more starved currents when the input clock signal is high and short one or more of the Schmitt trigger and one or more of the plurality of inverters to ground and the reference current when the input clock signal is low,
   wherein $T_{DEL}$ is based on $T_{CHARGE}$ and $T_{CHARGE}$ is based on C, $N_{TOP}$, $V_{ST,High}$, and a supply voltage ($V_{SUPL}$), and wherein the output clock signal is based on an inverse of the delayed clock signal and the input clock signal.

2. The clock delay circuit of claim 1, wherein $T_{DEL}$ is configured based on the following equation:

$$T_{DEL} = T_{CHARGE} = \frac{C}{N_{TOP} \times I_R} \times (V_{SUPL} - V_{ST,High}).$$

3. The clock delay circuit of claim 2, wherein the current mirror includes a current steering digital-to-analog converter (DAC) and $T_{DEL}$ is configurable by altering $N_{TOP}$, via the current steering DAC.

4. The clock delay circuit of claim 2, wherein the capacitor is implemented using a capacitor DAC and $T_{DEL}$ is configurable by altering C, via the capacitor DAC.

5. The clock delay circuit of claim 1, wherein the plurality of inverters includes one or more shaping inverters that are configured to further smooth edges of the delayed clock signal and are not current starved during any cycles of the delay circuit.

6. The clock delay circuit of claim 1, wherein the current mirror includes, at least, a P-channel metal-oxide-semiconductor (PMOS) current mirror and an N-type metal-oxide-semiconductor (NMOS) current mirror.

7. The clock delay circuit of claim 6, wherein each of the PMOS current mirror and the NMOS current mirror includes a plurality of metal-oxide-semiconductor field-effect transistor (MOSFET) components.

8. A clock delay circuit configured to generate a delayed clock signal based on an input clock signal, the delayed clock signal being delayed by a delay time ($T_{DEL}$), the clock delay circuit comprising:
   an input module configured to receive the input clock signal;
   a reference current source providing a reference current;
   a capacitor configured to charge or discharge based on the input clock signal and an output clock signal, the capacitor having a capacitance (C) and connected to a top node, C being configurable via a capacitor digital-to-analog converter (DAC) of the capacitor and $T_{DEL}$ being configurable via configuration of C;
   a current mirror configured to generate one or more starved currents based on the reference current and having a current scaling factor and configured to provide a scaled version of the reference current at the top node, scaled by a current scaling factor ($N_{TOP}$), the current mirror including a current steering DAC and $T_{DEL}$ is configurable by altering $N_{TOP}$, via the current steering DAC;

a switching module configured to provide current from the current source to charge the capacitor when the input clock signal is high and discharge the capacitor when the input clock signal is low;

a Schmitt trigger configured to generate a Schmitt trigger output signal in response to the input clock signal, wherein the Schmitt trigger output signal increases from a low signal to a high signal over a charging period of time ($T_{CHARGE}$) correlated with $T_{DEL}$, in response to a high signal input from the input clock signal, via the switching module, the high signal based on an upper threshold voltage ($V_{ST,High}$) of the Schmitt Trigger, wherein the Schmitt trigger output signal reverts to a low signal in response to a low signal from the input clock signal, and wherein the Schmitt trigger is configured to be current starved by a first starved current of the one or more starved currents from the current mirror when the input clock signal is high and the Schmitt trigger is configured to be shorted to ground and the reference current when the input clock signal is low; and a plurality of inverters configured to generate the delayed clock signal based on the Schmitt trigger output signal, wherein one or more of the plurality inverters are configured to be current starved by a second starved current of the one or more starved currents when the input clock signal is high and configured to be shorted to ground and the reference current when the input clock signal is low, wherein the plurality of inverters includes one or more shaping inverters that are configured to further smooth edges of the delayed clock signal and are not current starved during any cycles of the delay circuit, wherein the output clock signal is based on an inverse of the delayed clock signal and the input clock signal and wherein $T_{DEL}$ is based on $T_{CHARGE}$ and $T_{CHARGE}$ is based on C, $N_{TOP}$, $V_{ST,High}$, and a supply voltage ($V_{SUPL}$), and wherein $T_{DEL}$ is configured based on the following equation:

$$T_{DEL} = T_{CHARGE} = \frac{C}{N_{TOP} \times I_R} \times (V_{SUPL} - V_{S,High}).$$

9. The clock delay circuit of claim 8, further comprising a first plurality of switches configured to supply one or more of the Schmitt trigger and one or more of the plurality of inverters with the one or more starved currents when the input clock signal is high and short one or more of the Schmitt trigger and one or more of the plurality of inverters to ground and the reference current when the input clock signal is low.

* * * * *